US007701721B2

(12) United States Patent
Lin

(10) Patent No.: US 7,701,721 B2
(45) Date of Patent: Apr. 20, 2010

(54) EASILY DISASSEMBLING COOLING APPARATUS

(75) Inventor: Yu-Cheng Lin, Chung-Ho (TW)

(73) Assignee: Cooler Master Co., Ltd., Taipei Hsien (TW)

( * ) Notice: Subject to any disclaimer, the term of this patent is extended or adjusted under 35 U.S.C. 154(b) by 169 days.

(21) Appl. No.: 12/007,288

(22) Filed: Jan. 9, 2008

(65) Prior Publication Data

US 2008/0212289 A1 Sep. 4, 2008

(30) Foreign Application Priority Data

Jan. 31, 2007 (TW) .............................. 96201907 U

(51) Int. Cl.
*H25K 7/20* (2006.01)
*H01L 23/34* (2006.01)

(52) U.S. Cl. ....................... 361/719; 165/257; 257/714; 257/715

(58) Field of Classification Search ................. 361/719, 361/700, 699, 679.52; 165/80.3, 104.33, 165/185; 257/714, 715, 23; 174/15.2
See application file for complete search history.

(56) References Cited

U.S. PATENT DOCUMENTS 6,865,082 B2 * 3/2005 Huang et al. ................ 361/700
6,883,594 B2 * 4/2005 Sarraf et al. ........... 165/104.33

FOREIGN PATENT DOCUMENTS

TW M288399 3/2006

* cited by examiner

*Primary Examiner*—Mark A Robinson
*Assistant Examiner*—Jerry Wu
(74) *Attorney, Agent, or Firm*—Rosenberg, Klein & Lee

(57) ABSTRACT

An easily disassembling cooling apparatus is assembled onto a circuit board. The circuit board has an electronic element. The cooling apparatus includes a pair of fastening blocks, one or two heat conducting blocks, a heat pipe, a fastening plate, and a plurality of locking elements. The fastening blocks are fastened onto the circuit board and each has a track slot. The heat conducting block is installed between the fastening blocks and contacts the electronic element. One end of the heat pipe is installed with the heat conducting block. The fastening plate is installed in the track slots of the fastening blocks, and has a flexible arm that flexibly presses onto the heat pipe. Each of the locking elements respectively is combined with the fastening block. Thereby, the welding process is not required in the assembling process. The electronic element is reliably cooled, and the assembling time is reduced.

24 Claims, 8 Drawing Sheets

71 72 7 3 100 21 2 A 1 13 11 15 4 14 12 42 411 41 5 44 43 Z 900 800 81 X Y 61 6

EASILY DISASSEMBLING COOLING APPARATUS

BACKGROUND OF THE INVENTION

1. Field of the Invention

The present invention relates to a cooling apparatus. In particular, this invention relates to a cooling apparatus that is installed on an electronic device.

2. Description of the Related Art

The circuit board of an electronic device has a variety of electronic elements, such as a central processing unit (CPU). As the electronic industry has been developed, the operation speed of CPUs rapidly increases and thus the heat generated by CPUs also increases. Because electronic devices are generally enclosed by a housing, the temperature inside the housing rises substantially. Therefore, a cooling apparatus is required for the electronic elements in order to make the electronic device operate normally.

A variety of cooling apparatuses are developed for electronic elements. For example, Taiwan patent No. M288399 discloses a cooling apparatus. The cooling apparatus includes a cooling module, a plurality of heat pipes, a heat-absorbing module, a jig and a fastening module. The cooling module is made of a plurality of cooling fins that are disposed in parallel. One end of each of the heat pipes is assembled with the cooling module, and the second end of the heat pipe is located in the heat-absorbing module. The jig fastens onto the outer side of a heat-generating part (an electronic element) and the heat-absorbing module. The fastening module is installed between the heat-generating part and the heat-absorbing module for fastening the heat-generating part to the heat-absorbing module. Furthermore, the heat-absorbing module is welded to the heat pipes.

Although the cooling apparatus of the prior art can dissipate heat generated by the electronic elements, the heat-absorbing module still needs to be welded to the heat pipes. When the cooling apparatus is assembled with the electronic device, the assembler needs to weld the heat-absorbing module to the heat pipes and then assemble the other parts onto the electronic device. Therefore, the assembler needs to be skilled in the art of welding. Furthermore, it is inconvenient for the assembler.

Moreover, because the welding process is a lead soldering process, the soldering material contains lead. Recently, lead has been forbidden in electronic devices by the Europe Union. In order to meet the requirement for a lead-free manufacturing process, a new apparatus manufactured without lead is required.

SUMMARY OF THE INVENTION

One particular aspect of the present invention is to provide an easily disassembling cooling apparatus that can be installed on the circuit board and electronic elements of an electronic device. Its structure is simple. No welding is required when assembling the cooling apparatus. The assembling time is reduced, a lead-free manufacturing process is adopted, and the electronic elements are cooled reliably.

The easily disassembling cooling apparatus includes a pair of fastening blocks, one or two heat conducting blocks, at least one heat pipe, a fastening plate, and a plurality of locking elements. One side surface of each of the pair of fastening blocks has a track slot and a locking hole. The locking holes respectively link with the track slots. The two heat conducting blocks are installed between the pair of fastening blocks and have a receiving slot. One end of the heat pipe is installed in the receiving slot. The fastening plate is installed in the track slots of the pair of fastening blocks. The fastening plate extends to form a flexible arm that flexibly presses onto the heat pipe or one of the heat conducting blocks. The locking elements respectively screw into the locking holes and lean against the side of the fastening plate.

The fastening block is fastened onto a circuit board. The circuit board has an electronic element located between the pair of fastening blocks. One of the heat conducting blocks contacts the electronic element.

The present invention has the following characteristics. When the cooling apparatus of the present invention is assembled, the welding process is not required. The electronic elements can be cooled, the assembling time is reduced, and a lead-free manufacturing process is adopted.

For further understanding of the invention, reference is made to the following detailed description illustrating the embodiments and examples of the invention. The description is only for illustrating the invention and is not intended to limit of the scope of the claim.

BRIEF DESCRIPTION OF THE DRAWINGS

The drawings included herein provide a further understanding of the invention. A brief introduction of the drawings is as follows.

DETAILED DESCRIPTION OF THE PREFERRED EMBODIMENTS

Figure 1:
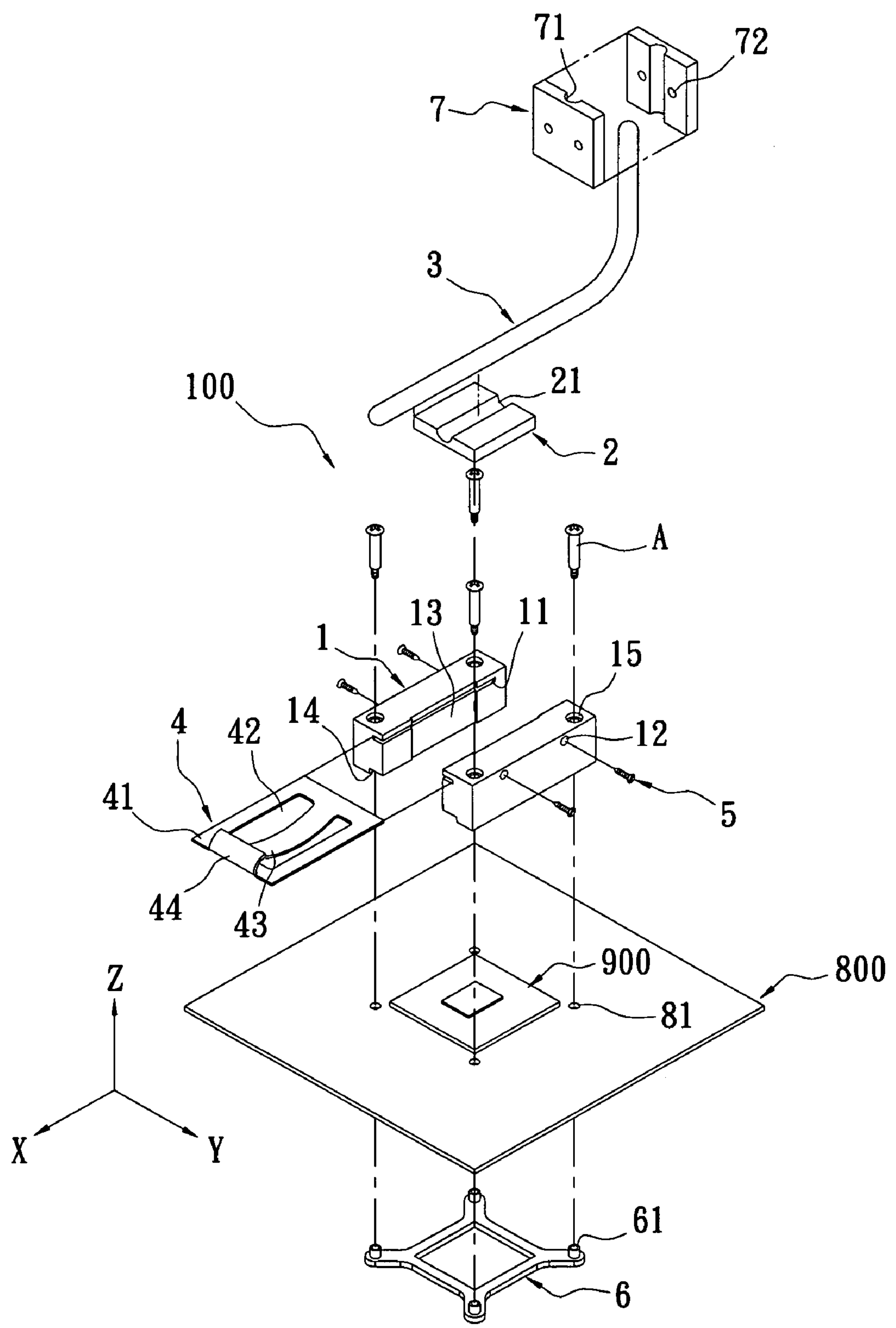
FIG. 1 is an exploded perspective view of the easily disassembling cooling apparatus of the first embodiment of the present invention.

Reference is made to FIG. 1, which shows the easily disassembling cooling apparatus of the first embodiment of the present invention. The cooling apparatus 100 can be assembled with the circuit board 800 of an electronic device. The circuit board 800 is installed with an electronic element 900, such as a CPU, that will generate heat when the electronic element 900 is operating. The cooling apparatus 100 includes a pair of fastening blocks 1, a heat conducting block 2, at least one heat pipe 3, a fastening plate 4, and a plurality of locking elements 5.

The quantity of the fastening blocks 1 is two, and the pair of fastening blocks 1 are symmetrical. The pair of fastening blocks 1 are made of metal or plastic. One inner side surface of each of the pair of fastening blocks 1 that is close to the upper side has a horizontal track slot 11 along the X-coordinate and a plurality of locking holes 12 along the Y-coordinate that respectively link with the track slot 11.

The inner side surface of each of the pair of fastening blocks 1 forms a concave slot 13 along the Z-coordinate, and the lower side of the inner side surface of each of the pair of fastening blocks 1 has a horizontal opening slot 14 along the X-coordinate and a plurality of positioning holes 15 along the Z-coordinate.

The heat conducting block 2 is made of a metal material with a high conducting coefficient, such as cooper, aluminum or other metal materials with a heat-absorbing characteristic. The upper surface of the heat conducting block 2 forms at least one receiving slot 21 along the x-coordinate.

The heat pipe 3 can be L-shaped, U-shaped, or I-shaped. The quantity of the heat pipe 3 depends on the requirement. In this embodiment, the quantity of the heat pipe 3 is one. The structure of the heat pipe 3 is acknowledged by the people having ordinary skill in the art, and is not repeated again.

The fastening plate 4 has a body 41, an opening 42 on the body 41, a flexible arm 43 that corresponds to the opening 42 and extends downwards in a curved from one end of the inner side of the body 41 along the Z-coordinate, and a pushing portion 44 that extending upwards in a curved from another end of the body 41 along the Z-coordinate. The pushing portion 44 corresponds to the flexible arm 44.

Figure 2:
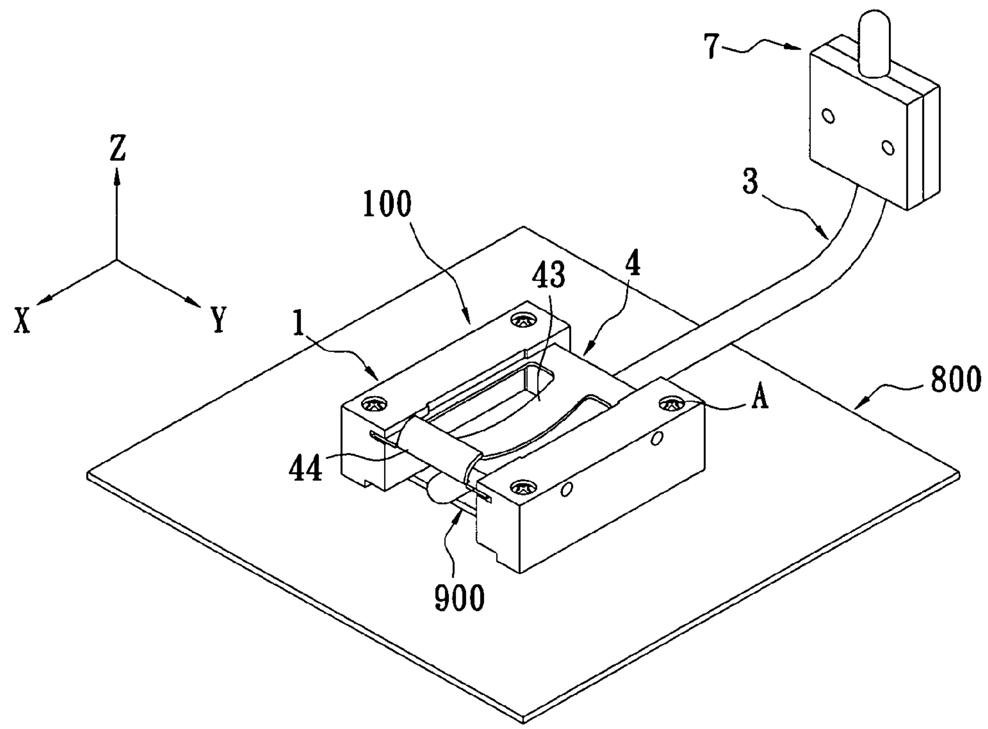
FIG. 2 is an assembly perspective view of the easily disassembling cooling apparatus of the first embodiment of the present invention.
Figure 3:
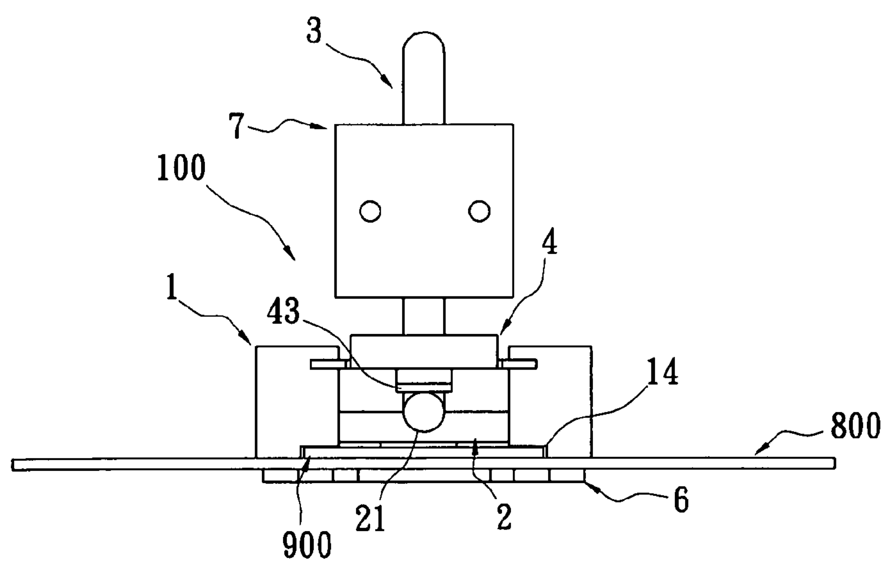
FIG. 3 is a front view of the easily disassembling cooling apparatus of the first embodiment of the present invention.

Reference is made to FIGS. 1~3, when the cooling apparatus is assembled, the pair of fastening blocks 1 are fastened onto the circuit board 800, and are located at two sides of the electronic element 900. When the circuit board 800 includes a screw column (not shown in the figure), a fastening element A (such as a screw) passes through each of the positioning holes 15 to lock with the screw column. Thereby, the pair of fastening blocks 1 is fastened onto the circuit board 800.

The present invention further includes a locking board 6 having a plurality of combining columns 61. When the circuit board 800 has the holes 81, the locking board 6 and the pair of fastening blocks 1 respectively are located at two sides of the circuit board 800. One fastening element A passes through the positioning hole 15 and the hole 81 of the circuit board 800 to lock with the combining column 61 of the locking board 6. Thereby, the pair of fastening blocks 1 are firmly fastened onto the circuit board 800.

The positioning hole 15 of the fastening blocks 1 can be a circular hole, a sinking hole, or an oval-shaped hole. When the positioning hole 15 of the fastening blocks 1 is an oval-shaped hole, the location of the pair of fastening blocks 1 on the circuit board 800 can be adjusted along the X-coordinate or the Y-coordinate by using the fastening element A and the oval-shaped positioning hole 15.

When the pair of fastening blocks 1 is assembled with the circuit board 800, the two side edges of the electronic element 900 are respectively located in the opening slots 14 of the pair of fastening blocks 1 so that the pair of fastening blocks 1 respectively contact against the two side edges of the electronic element 800 (as shown in FIG. 3).

The heat conducting block 2 is placed onto the surface of the electronic element 900 from the concave slot 13 of the pair of fastening blocks 1 along the Z-coordinate from top to bottom. Therefore, the heat conducting block 2 is installed between the pair of fastening blocks 1, the two side edges of the heat conducting block 2 are located in the concave slot 13, and the lower surface of the heat conducting block 2 fully contacts the surface of the electronic element 900.

One end (the heat-absorbing end) of the heat pipe 3 is assembled in the receiving slot 21 of the heat conducting block 2. The quantity of the receiving slot 21 depends on the quantity of the heat pipe 3. The fastening plate 4 horizontally slides into the track slot 11 of the pair of fastening blocks 1 along the X-coordinate (a direction that is parallel to the track slot 11) to make the flexible arm 43 flexibly press onto the heat pipe 3 so that the heat pipe 3 tightly contacts the heat conducting block 2 and the heat conducting block 2 tightly contacts the electronic element 900. Finally, each of the locking elements 5 respectively are screwed with the corresponding locking holes 12 to make the front end of the locking element 5 contact against the side edge of the fastening plate 4 for fastening the fastening plate 4.

As shown in FIG. 1, the locking element 5 is a screw that is screwed with the locking hole 12 of the fastening block 1 and contacts against the side edge of the fastening plate 4 for preventing the fastening plate 4 from loosing.

The pushing portion 44 of the fastening plate 4 can be pushed by the user's finger to make the fastening plate 4 slide along the track slot 11.

Figure 4:
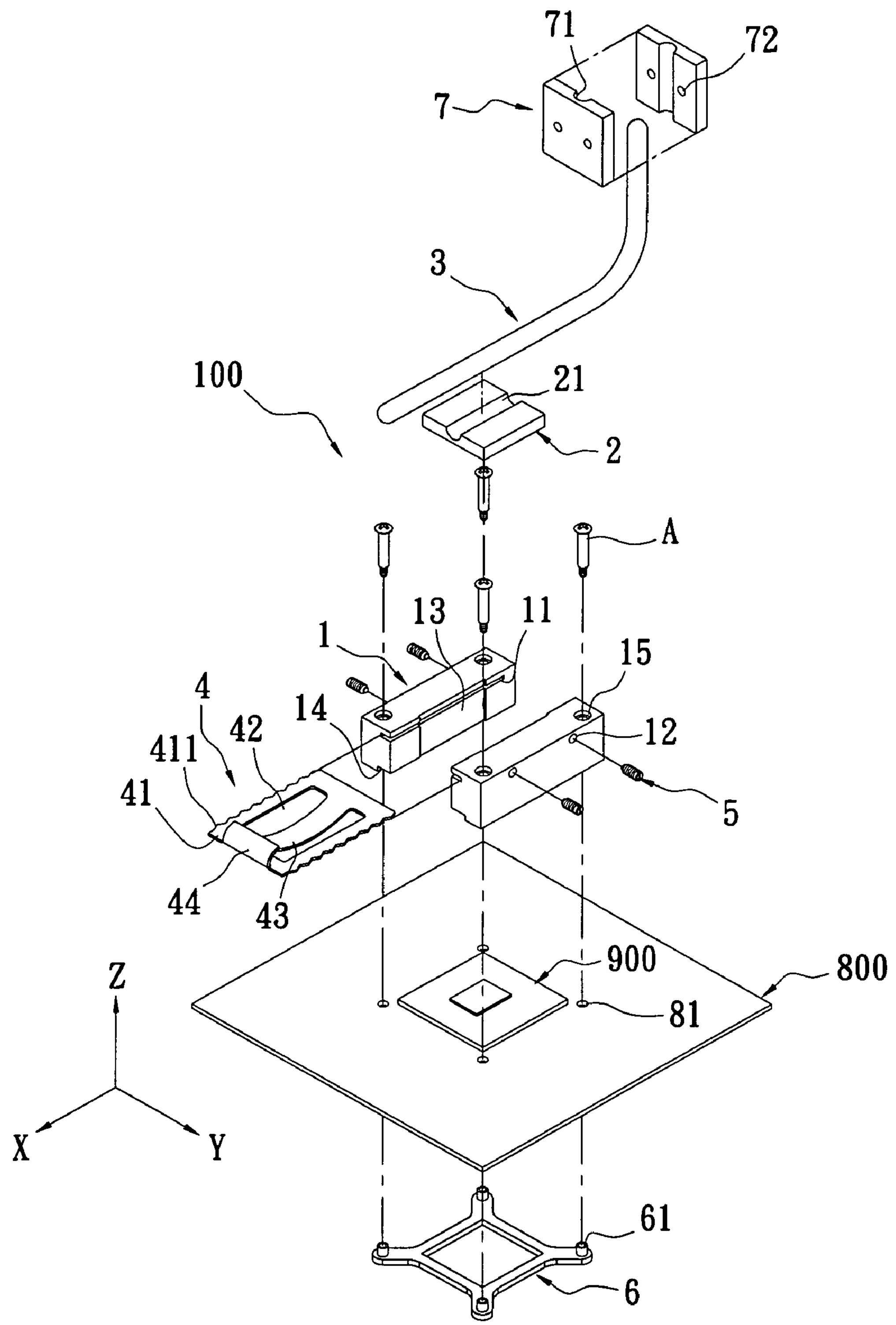
FIG. 4 is an exploded perspective view of the easily disassembling cooling apparatus of the second embodiment of the present invention.
Figure 5:
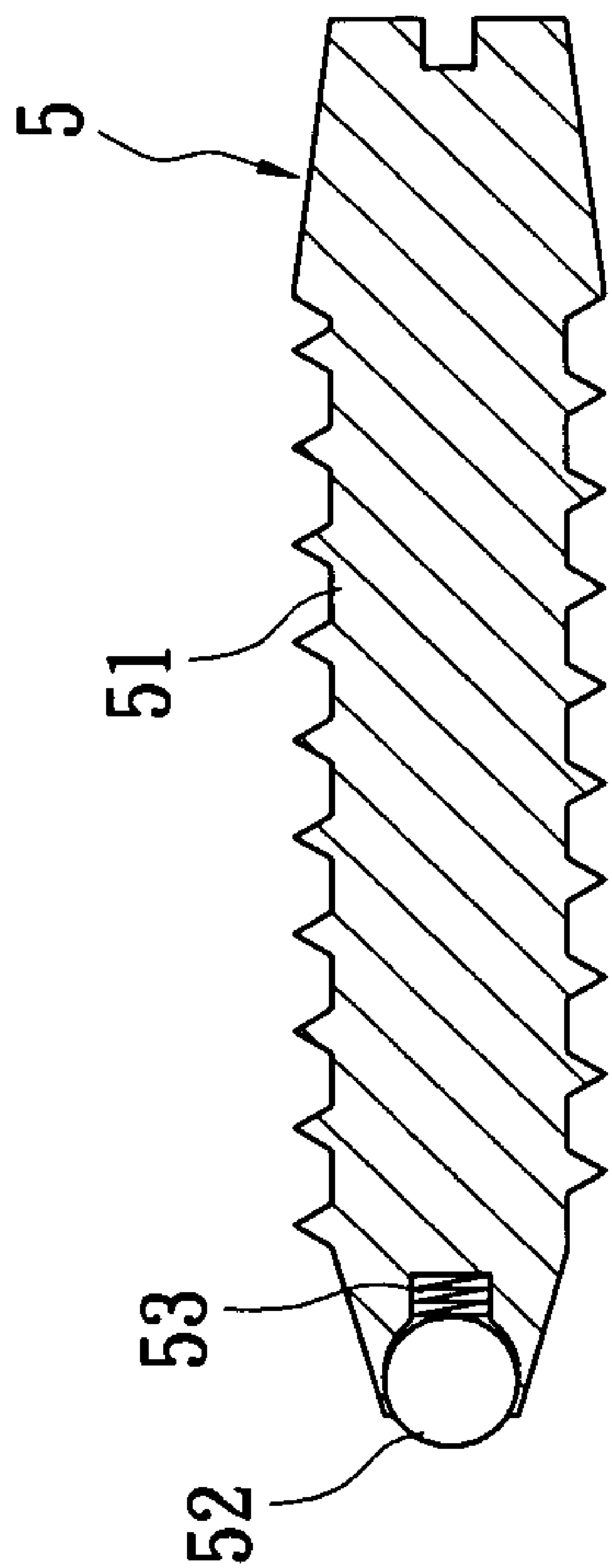
FIG. 5 is a cross-sectional view of the stopping screw of the second embodiment of the present invention.

FIGS. 4 and 5 show the easily disassembling cooling apparatus of the second embodiment of the present invention. In this embodiment, the two opposite side edges of the body 41 of the fastening plate 4 further have a plurality of tooth portions 411. The locking element 5 is a stopping screw that has a screw rod 51, a steel ball 52 installed in the screw rod 51, and a spring 53 installed in the screw rod 51 and flexibly pressing the steel ball 52. When the two side edges of the fastening plate 4 form the tooth portions 411 and the screw rod 51 of the stopping screw is screwed in the locking hole 12 to make the steel ball 52 contact against the base portion (tooth valley) of two adjacent tooth portions 411, the steel ball 52 flexibly contacts against the front edge of the fastening plate 4 by utilizing the flexible force of the sparing 53 to prevent the fastening plate 4 from loosing. Thereby, the assembling process is finished.

When the cooling apparatus is disassembled, a process that is inverse to the assembling process described as above is adopted to disassemble the cooling apparatus 100, and the process is not repeated again. The user presses the pushing portion 44 of the fastening plate 4 to make the fastening plate 4 slide along the track slot 11.

Figure 6:
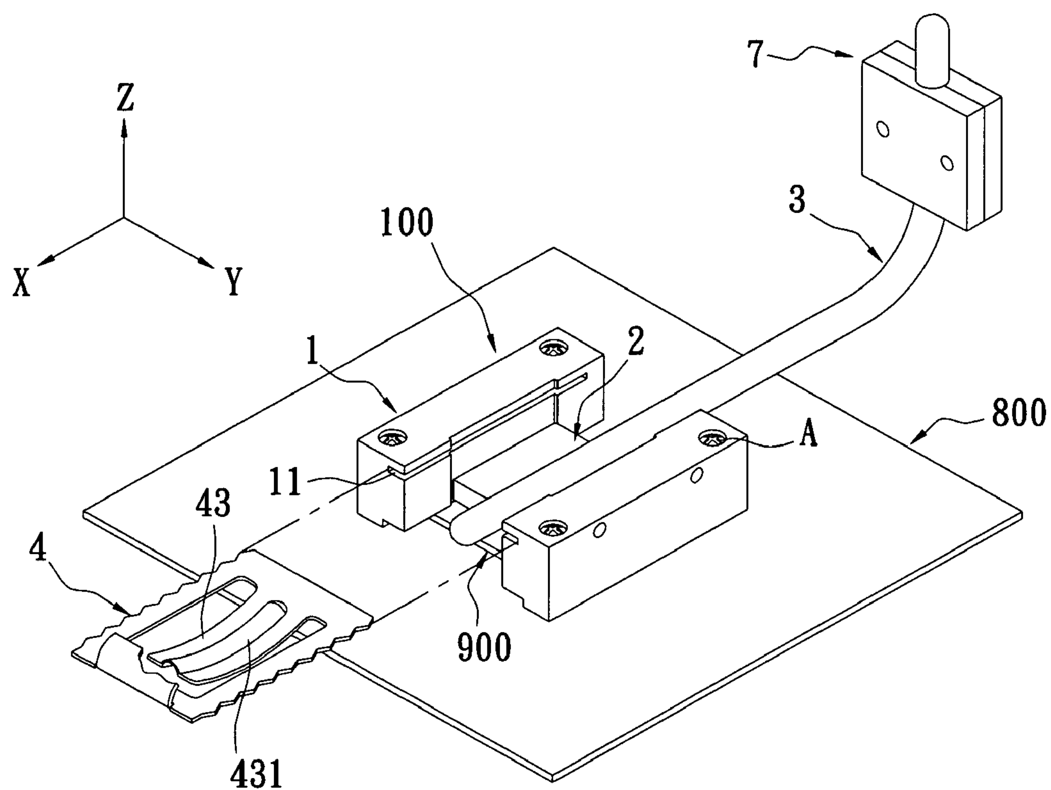
FIG. 6 is an exploded perspective view of the easily disassembling cooling apparatus of the third embodiment of the present invention.

FIG. 6 shows the easily disassembling cooling apparatus of the third embodiment of the present invention. This embodiment can be applied to the above embodiments. The difference between the third embodiment and the above embodiments is that the flexible arm 43 of the fastening plate 4 bulges upwards along the X-coordinate to form a semi-arc bulging portion 431, one end of the heat pipe 3 is located in the bulging portion 431, and the bulging portion 431 flexibly presses onto the heat pipe 3.

Figure 7:
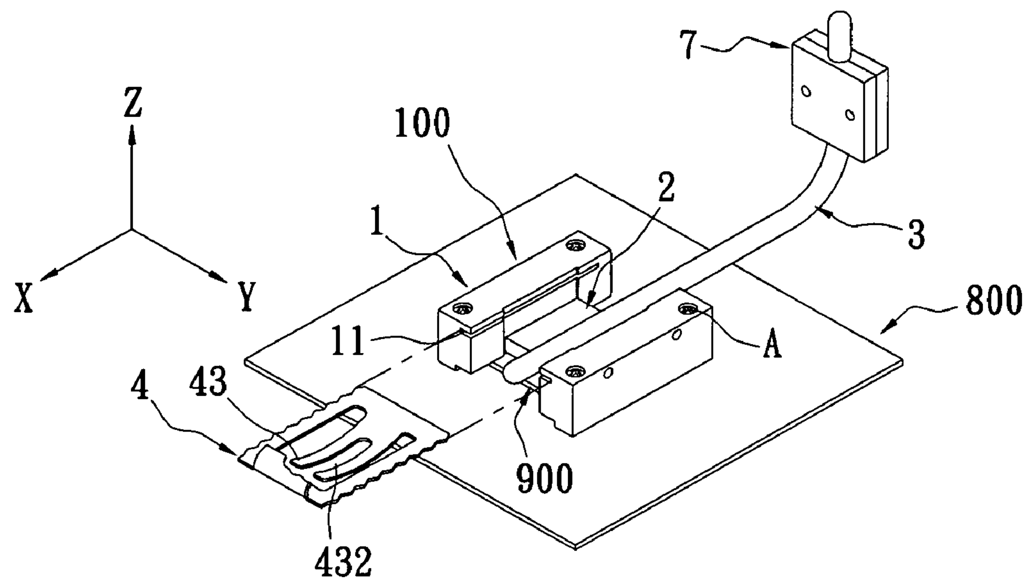
FIG. 7 is an exploded perspective view of the easily disassembling cooling apparatus of the fourth embodiment of the present invention.

FIG. 7 shows the easily disassembling cooling apparatus of the fourth embodiment of the present invention. This embodiment can be applied to the first and the second embodiments. The difference between the fourth embodiment and the previous embodiment is that one end of the flexible arm 43 of the fastening plate 4 has a cross slot 432 along the X-coordinate so that the flexible arm 43 has a diverged shape. One end of the heat pipe 3 is located in the cross slot 432, and the flexible arm 43 flexibly presses onto the heat pipe 3.

Figure 8:
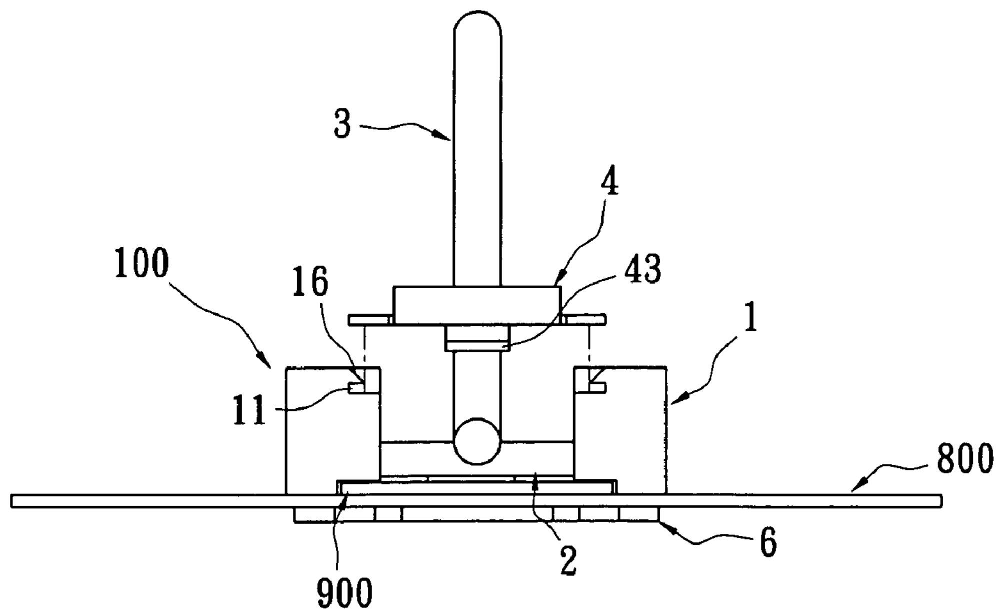
FIG. 8 is a front view of the easily disassembling cooling apparatus of the fifth embodiment of the present invention.

FIG. 8 shows the easily disassembling cooling apparatus of the fifth embodiment of the present invention (also referring to FIG. 1). A guiding slanted surface 16 is formed at the upper side of the inner side surface of the pair of the fastening blocks 1 along the X-coordinate and the Z-coordinate. The guiding slanted surface 16 is located above the track slot 11. By using the guiding slanted surface 16, the fastening plate 4 is embedded into the track slot 11 from top to bottom along the Z-coordinate.

When the fastening block 1 has the guiding slanted surface 16, there are two methods to assemble the fastening plate 4. One method is to slide the fastening plate 4 into the track slot 11 along the X-coordinate (that is parallel to the track slot 11) so that the fastening plate 4 is assembled between the pair of the fastening blocks 1. The second method is to embed the fastening plate 4 into the track slot 11 from the guiding slanted surface 16 and along the Z-coordinate (that is vertical to the track slot 11) so that the fastening plate 4 is assembled between the pair of the fastening blocks 1.

Furthermore, in above embodiments, at least one cooling block 7 is included. The material of the cooling block 7 is the same as the material of the heat conducting block 2 and is a metal material with a high heat conductivity. The quantity of the cooling block 7, depends on the requirement, such as one or two. In this embodiment, there are two cooling blocks 7. The two cooling blocks 7 respectively has a receiving slot 71 that corresponds to each other, and a plurality of through holes 72.

The receiving slots 71 of the two cooling blocks 7 receives the second end (condensing terminal) of the heat pipe 3, and the through holes 72 of the two cooling blocks 7 are passes by the fastening parts (not shown in the figure), such as screws and bolts etc, so that the cooling blocks 7 lock onto the interior or the exterior of the housing (not shown in the figure) receiving the circuit board 800. Alternatively, the cooling block 7 also can be combined with other device.

The heat generated by the electronic element 900 can be rapidly transmitted to the heat pipe 3 via the heat conducting block 2, and the heat is rapidly dissipated by the heat pipe 3. Thereby, the cooling effect is achieved. Furthermore, by locking the cooling block 7 onto the housing, the heat can be rapidly exchanged between the heat-absorbing terminal and the condensing terminal of the heat pipe 3 so that the heat of the electronic element 900 is rapidly dissipated. Because the surface of the heat-conducting block 2 is smooth, the heat-conducting block 2 fully contacts the electronic element 900 so that the heat-conducting effect is good. The structure of the cooling apparatus 100 is simplified, and the welding process is not required in the assembling process. By using above cooling apparatus, the electronic element 900 is cooled. The assembling time is reduced, and a lead-free manufacturing process is adopted.

Figure 9:
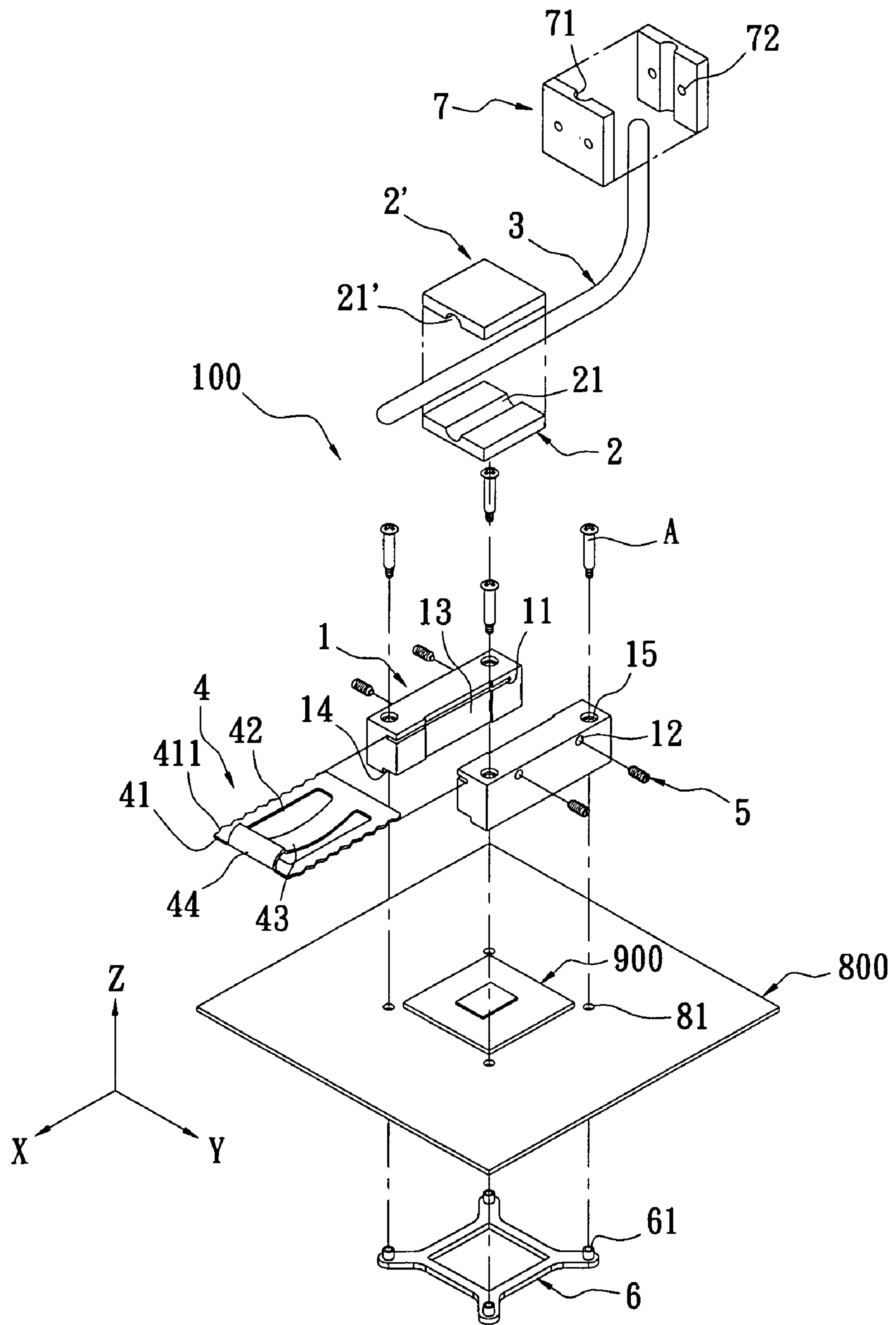
FIG. 9 is an exploded perspective view of the easily disassembling cooling apparatus of the sixth embodiment of the present invention.
Figure 10:
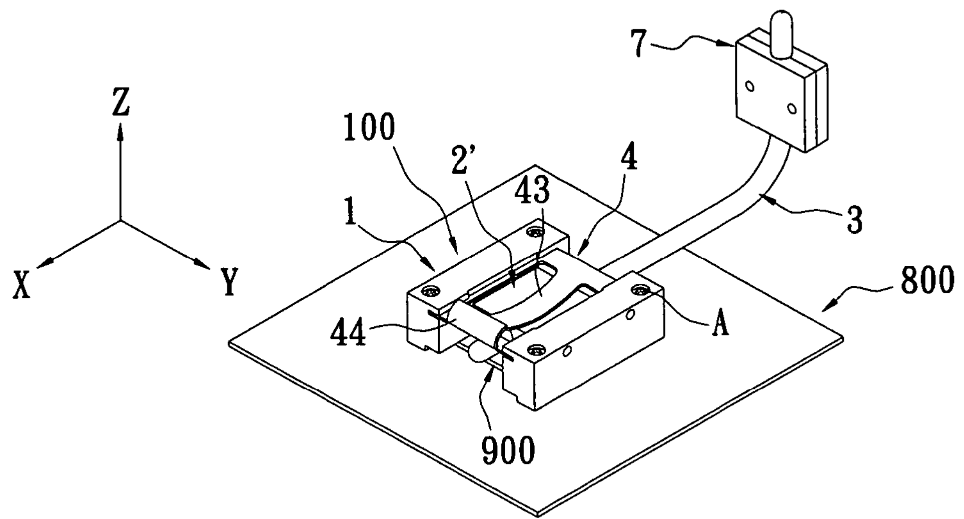
FIG. 10 is an assembly perspective view of the easily disassembling cooling apparatus of the sixth embodiment of the present invention.

Reference is made to FIGS. 9 and 10, which show the easily disassembling cooling apparatus of the sixth embodiment of the present invention. A pair of heat-conducting blocks 2, 2' is included. The pair of heat-conducting blocks 2, 2' respectively have receiving slots 21, 21' that corresponds to each other.

When the pair of heat-conducting blocks 2, 2' is assembled, one heat-conducting block 2 is assembled between the pair of the fastening blocks 1 to make the lower surface of the heat-conducting block 2 fully contact the surface of the electronic element 900. The heat pipe 3 is located in the receiving slot 21 of the heat-conducting block 2. Next, the other heat-conducting block 2' is assembled between the pair of the fastening blocks 1 to make the heat pipe 3 is located in the receiving slot 21' of the heat-conducting block 2'. Finally, the fastening plate 4 is assembled in the track slot 11 of the pair of the fastening blocks 1 so that the flexible arm 43 flexibly presses onto the surface of the heat-conducting block 2'. Thereby, the effects of the previous embodiments are achieved. Moreover, in this embodiment, one or two cooling blocks 7 are included to combine with the other end of the heat pipe 3.

Figure 11:
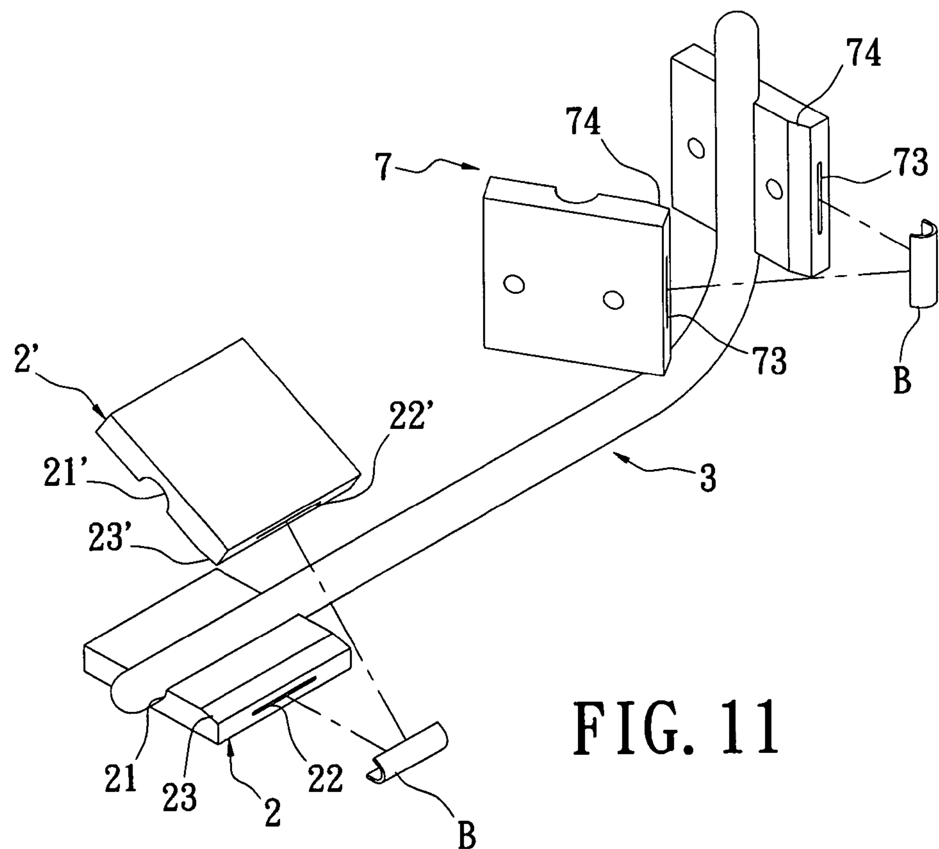
FIG. 11 is an exploded perspective view of part of the easily disassembling cooling apparatus of the seventh embodiment of the present invention.

Reference is made to FIG. 11, which shows the easily disassembling cooling apparatus of the seventh embodiment of the present invention. The difference between the seventh embodiment and the sixth embodiment is that there is a plug hole 22, 22' and a slanted surface 23, 23' on one side surface of the pair of heat-conducting blocks 2, 2', or there is a plug hole 22, 22' on each of two side surfaces and a slanted surface 23, 23' on each of two surfaces. FIG. 9 shows that there is a plug hole 22, 22' and a slanted surface 23, 23' on one side surface of the two heat-conducting blocks 2, 2'. Two plug holes 22, 22' are plugged onto a flexible part B to flexibly connect the two the heat-conducting blocks 2, 2'. The flexible part B has a U-shape or an inversed-U shape, and is made of a flexible wire or a plate part. The two opposite sides of the flexible part B are slanted.

By utilizing the flexible part B, the two slanted surfaces 23, 23' of the two heat-conducting blocks 2, 2' contact to each other, and the two heat-conducting blocks 2, 2' have an opened shape and the assembler can install the heat pipe 3 between the two heat-conducting blocks 2, 2'. When the flexible arm 43 of the fastening plate 4 presses onto the heat-conducting block 2' (referring to FIG. 10), the pair of heat-conducting blocks 2, 2' are enclosed to hold the heat pipe 3.

Alternatively, the seventh embodiment can be implemented in the two cooling blocks 7 described in above embodiments. There is a plug hole 73, and a slanted surface 74 on one side surface of the two cooling blocks 7, or there is a plug hole 73 on each of two side surfaces of the two cooling blocks 7 and a slanted surface 74 on each of two surfaces of the two cooling blocks 7 (not shown in the figure). Two plug holes 73 of the two cooling blocks 7 are plugged together with a flexible part B to achieve the same effect as the pair of heat-conducting blocks 2, 2'.

Furthermore, the receiving slot 21 of the heat-conducting block 2, the receiving slots 21, 21' of the two heat-conducting blocks 2, 2' and the receiving slot 71 of the cooling block 7 can be spread with a cooling coating (not shown in the figure) to enhance the cooling effect.

The description above only illustrates specific embodiments and examples of the invention. The invention should therefore cover various modifications and variations made to the herein-described structure and operations of the invention, provided they fall within the scope of the invention as defined in the following appended claims.

What is claimed is:

1. An easily disassembling cooling apparatus, comprising:

a pair of fastening blocks, wherein side surfaces of each of the fastening blocks has a track slot and a locking hole, and the locking holes respectively link with the track slots;

a heat conducting block installed between the pair of fastening blocks having at least one receiving slot;

at least one heat pipe, wherein one end of the heat pipe is installed in the receiving slot;

a fastening plate installed in the track slots of the pair of fastening blocks, wherein the fastening plate extends to form a flexible arm that flexibly presses onto the heat pipe; and a plurality of locking elements respectively screwed in the locking holes and contacting against a side edge of the fastening plate.

2. The easily disassembling cooling apparatus as claimed in claim 1, wherein the pair of fastening blocks are correspondingly located on a circuit board, the circuit board has an electronic element located between the pair of fastening blocks, and the heat conducting block contacts the electronic element.

3. The easily disassembling cooling apparatus as claimed in claim 1, wherein the pair of fastening blocks respectively have a positioning hole, and the positioning holes are respectively passed by a fastening part.

4. The easily disassembling cooling apparatus as claimed in claim 3, further comprising a locking board part, wherein the locking board part and the fastening parts are combined by a screw.

5. The easily disassembling cooling apparatus as claimed in claim 1, wherein the side surfaces of the pair of fastening blocks respectively have a guiding slanted surface, the guiding slanted surfaces are respectively located above the track slots, the fastening plate slides into the track slots along a direction that is parallel to the track slots, or embeds into the track slots via the guiding slanted surfaces and along a direction that is vertical to the track slots.

6. The easily disassembling cooling apparatus as claimed in claim 1, wherein a second end of the heat pipe further is combined with at least one cooling block, and the cooling block has a receiving slot to receive the heat pipe.

7. The easily disassembling cooling apparatus as claimed in claim 6, wherein the quantity of the at least one cooling block is two, and the two cooling blocks respectively have a plug hole for being plugged with a flexible part to flexibly connect two cooling blocks.

8. The easily disassembling cooling apparatus as claimed in claim 1, wherein the fastening plate has a body, and an opening located on the body, and the flexible arm corresponds to the opening and is formed by flexibly extending and bending downwards from one side of the body.

9. The easily disassembling cooling apparatus as claimed in claim 8, wherein a second side of the body extends upwards to form a pushing portion.

10. The easily disassembling cooling apparatus as claimed in claim 1, wherein the fastening plate slides into the track slots along a direction that is parallel to the track slots.

11. The easily disassembling cooling apparatus as claimed in claim 1, wherein the locking element is a screw or a stopping screw, the stopping screw has a screw rod, a steel ball installed in the screw rod and a spring installed in the screw rod and flexibly pressing the steel ball, two side edges of the fastening plate respectively form tooth portions, and the steel ball contacts against a base portion of the two adjacent tooth portions.

12. An easily disassembling cooling apparatus, comprising:

a pair of fastening blocks, wherein side surfaces of each of the fastening blocks has a track slot and a locking hole, and the locking holes respectively link with the track slots;

two heat conducting blocks installed between the pair of fastening blocks and respectively having at least one receiving slot;

at least one heat pipe, wherein one end of the heat pipe is installed in the receiving slot of the heat conducting blocks;

a fastening plate installed in the track slots of the pair of fastening blocks, wherein the fastening plate extends to form a flexible arm that flexibly presses onto one of the pair of heat conducting blocks; and a plurality of locking elements respectively screwed in the locking holes and contacting against a side edge of the fastening plate.

13. The easily disassembling cooling apparatus as claimed in claim 12, wherein the pair of fastening blocks is located on a circuit board, the circuit board has an electronic element located between the pair of fastening blocks, and one of the two heat conducting blocks contacts the electronic element.

14. The easily disassembling cooling apparatus as claimed in claim 12, wherein the pair of fastening blocks respectively have a positioning hole, and the positioning holes are respectively passed by a fastening part.

15. The easily disassembling cooling apparatus as claimed in claim 14, further comprising a locking board part, wherein the locking board part and the fastening parts are combined by a screw.

16. The easily disassembling cooling apparatus as claimed in claim 12, wherein the side surfaces of the pair of fastening blocks respectively have a guiding slanted surface, the guiding slanted surfaces are respectively located above the track slots, the fastening plate slides into the track slots along a direction that is parallel to the track slots, or embeds into the track slots via the guiding slanted surfaces and along a direction that is vertical to the track slots.

17. The easily disassembling cooling apparatus as claimed in claim 12, wherein the side surfaces of the pair of fastening blocks respectively have a concave slot, and two side edges of the two the heat conducting blocks are respectively located in the concave slots.

18. The easily disassembling cooling apparatus as claimed in claim 12, wherein the two heat conducting blocks respectively have a plugging hole for being plugged with a flexible part to flexibly connect the two heat conducting blocks.

19. The easily disassembling cooling apparatus as claimed in claim 12, wherein a second end of the heat pipe further is combined with at least one cooling block, and the cooling block has a receiving slot to receive the heat pipe.

20. The easily disassembling cooling apparatus as claimed in claim 19, wherein the quantity of the at least one cooling block is two, and the two cooling blocks respectively have a plug hole for being plugged with a flexible part to flexibly connect two cooling blocks.

21. The easily disassembling cooling apparatus as claimed in claim 12, wherein the fastening plate has a body, and an opening located on the body, and the flexible arm corresponds to the opening and is formed by flexibly extending and bending downwards from one side of the body.

22. The easily disassembling cooling apparatus as claimed in claim 21, wherein a second side of the body extends upwards to form a pushing portion.

23. The easily disassembling cooling apparatus as claimed in claim 12, wherein the fastening plate slides into the track slots along a direction that is parallel to the track slots.

24. The easily disassembling cooling apparatus as claimed in claim 12, wherein the locking element is a screw or a stopping screw, the stopping screw has a screw rod, a steel ball installed in the screw rod and a spring installed in the screw rod and flexibly pressing the steel ball, two side edges of the fastening plate respectively form tooth portions, and the steel ball contacts against a base portion of two adjacent tooth portions.

* * * * *